(12) United States Patent
Zhang et al.

(10) Patent No.: US 10,079,208 B2
(45) Date of Patent: Sep. 18, 2018

(54) IC STRUCTURE WITH INTERFACE LINER AND METHODS OF FORMING SAME

(71) Applicant: GLOBALFOUNDRIES INC., Grand Cayman (KY)

(72) Inventors: Xunyuan Zhang, Albany, NY (US); Moosung M. Chae, Saratoga Springs, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/221,647

(22) Filed: Jul. 28, 2016

(65) Prior Publication Data

US 2018/0033728 A1    Feb. 1, 2018

(51) Int. Cl.
| H01L 23/528 | (2006.01) |
| H01L 29/45 | (2006.01) |
| H01L 29/40 | (2006.01) |
| H01L 21/768 | (2006.01) |
| H01L 21/8234 | (2006.01) |
| H01L 27/088 | (2006.01) |
| H01L 29/417 | (2006.01) |

(52) U.S. Cl.
CPC .... *H01L 23/5283* (2013.01); *H01L 21/76804* (2013.01); *H01L 21/76883* (2013.01); *H01L 21/823475* (2013.01); *H01L 27/0883* (2013.01); *H01L 29/401* (2013.01); *H01L 29/41725* (2013.01); *H01L 29/45* (2013.01)

(58) Field of Classification Search
CPC ....... H01L 2221/1073; H01L 21/76858; H01L 21/76855; H01L 21/28518; H01L 21/76897; H01L 29/665
See application file for complete search history.

(56) References Cited

U.S. PATENT DOCUMENTS 6,284,644 B1 * 9/2001 Aug .......................... G01V 3/15
                                                257/E21.576
8,836,129 B1 * 9/2014 Hung .................... H01L 23/485
                                                257/758

(Continued)

OTHER PUBLICATIONS

Office Action and English translation thereof for DE Patent Application No. 10 2017 212 653.1. prepared by Patent Office dated Aug. 10, 2017, P113013APjsi (GFM-0005-DE), 5 pages.

*Primary Examiner* — Marcos D Pizarro
*Assistant Examiner* — Shannon Yi
(74) *Attorney, Agent, or Firm* — Francois Pagette; Hoffman Warnick LLC

(57) ABSTRACT

Embodiments of the present disclosure may provide a method of forming an integrated circuit (IC) structure, the method including: providing a structure with: a conductive region, and an inter-level dielectric (ILD) material positioned on the conductive region, wherein the ILD material includes a contact opening to the conductive region; forming a doped metal layer within the contact opening such that the doped metal layer overlies the conductive region, wherein the doped metal layer includes a first metal doped with a second metal; and forming a contact to the conductive region within the contact opening of the ILD material by annealing the doped metal layer such that the second metal diffuses into the ILD material to form an interface liner directly between the annealed doped metal layer and the ILD material.

15 Claims, 5 Drawing Sheets

(56) References Cited

U.S. PATENT DOCUMENTS

| | | | | |
|---|---|---|---|---|
| 9,153,481 | B2* | 10/2015 | Matsumoto | H01L 23/53266 |
| 2008/0305621 | A1* | 12/2008 | Dyer | H01L 21/28026 |
| | | | | 438/585 |
| 2010/0207177 | A1 | 8/2010 | Liu et al. | |
| 2011/0006429 | A1* | 1/2011 | Liu | H01L 21/76831 |
| | | | | 257/751 |
| 2011/0057317 | A1 | 3/2011 | Koike et al. | |
| 2012/0164826 | A1* | 6/2012 | Matsuda | H01L 21/02063 |
| | | | | 438/653 |
| 2012/0171864 | A1* | 7/2012 | Akiyama | H01L 21/28518 |
| | | | | 438/675 |
| 2014/0299988 | A1 | 10/2014 | Cabral, Jr. | |
| 2015/0179579 | A1* | 6/2015 | Jezewski | H01L 21/76846 |
| | | | | 257/753 |
| 2015/0255331 | A1 | 9/2015 | Zhang et al. | |
| 2015/0270215 | A1* | 9/2015 | Peng | H01L 23/5226 |
| | | | | 257/751 |
| 2015/0380305 | A1* | 12/2015 | Basker | H01L 21/76846 |
| | | | | 257/77 |
| 2016/0049362 | A1 | 2/2016 | Lin et al. | |

* cited by examiner

IC STRUCTURE WITH INTERFACE LINER AND METHODS OF FORMING SAME

BACKGROUND

Technical Field

The present disclosure relates to integrated circuits (ICs) with interface liners adjacent to conductive contacts, and more specifically, to IC structures with interface liners which include metal compounds diffused from a doped metal contact, and methods of forming the same.

Related Art

Each IC can be made up of billions of interconnected devices, such as transistors, resistors, capacitors, and diodes, located on one or more chips of semiconductor substrate material. The quality and viability of a product including an IC can be at least partially dependent on the techniques used for fabricating the IC and the structure of various components therein. Fabrication of an IC can include two phases: front-end-of-line processes (FEOL) and back-end-of-line processes (BEOL). FEOL generally includes fabrication processes performed on a wafer up to and including the formation of a first "metal level," i.e., a metal wire for connecting several semiconductor devices together. In the case of a transistor, a group of vertically-extending conductive contacts can provide electrical connections to the transistor from other functional elements of a circuit. BEOL generally includes fabrication processes following the formation of the first metal level, including the formation of all subsequent metal levels. Each metal level can include metal wires therein, which can be connected to other metal levels through vertically-oriented conducting wires known as vias. In conventional BEOL processing, a layer of vias is formed to connected devices in an IC structure to a layer of metal wires formed on top of the vias, with a successive layer of vias formed thereon, followed by another layer of meal wires, etc. To provide greater scaling and sophistication of the fabricated device, the number of metal levels can be varied to suit a particular application, e.g., by providing four to six metal levels, or as many as, in a further example, sixteen or more metal levels.

Conductive contacts extending between levels, or similar structures such as vias, may be fabricated to include additional materials for providing separation between conductive metals and insulating materials in the IC structure. Both contacts and vias are referred to collectively herein by use of the terms "contact," "metal contact," and/or "conductive contact." In conventional processing, such structures may include refractory metal liners formed on sidewalls of an opening in which metal contacts are formed. Refractory metal liners can prevent electromigration of conductive materials into adjacent portions of the IC structure. Although refractory metal liners have proven satisfactory for such purposes, conventional formation of such materials may require forming additional materials and/or removing portions thereof in additional process steps, which may increase the time and costs to manufacture a product. Despite these contributions to time and cost, removing refractory metal liners from a circuit structure has proven unsatisfactory for maintaining the quality and intended functions in an IC structure fabricated with conventional techniques.

SUMMARY

A first aspect of the disclosure provides a method of forming an integrated circuit (IC) structure, the method including: providing a structure including: a conductive region, and an inter-level dielectric (ILD) material positioned on the conductive region, wherein the ILD material includes a contact opening to the conductive region; forming a doped metal layer within the contact opening such that the doped metal layer overlies the conductive region, wherein the doped metal layer includes a first metal doped with a second metal; and forming a contact to the conductive region within the contact opening of the ILD material by annealing the doped metal layer such that the second metal diffuses into the ILD material to form an interface liner directly between the annealed doped metal layer and the ILD material.

A second aspect of the disclosure provides a method of forming a conductive contact to a transistor structure in an integrated circuit (IC), the method including: forming a contact opening within an ILD material positioned over the transistor structure, wherein forming the contact opening exposes a source/drain region or a gate metal of the transistor structure; forming a source/drain silicide on the source/drain region, after forming the contact opening; forming a doped metal layer within the contact opening, wherein the doped metal layer includes a first metal doped with a second metal; and forming a contact to the conductive region within the contact opening of the ILD material by annealing the doped metal layer, such that the second metal diffuses into the ILD material to form an interface liner directly between the annealed doped metal layer and the ILD material.

A third aspect of the disclosure provides an integrated circuit (IC) structure including: a transistor structure including: a substrate including a source/drain region, a source/drain silicide positioned on the source/drain region of the substrate, and a gate metal positioned over the substrate; an inter-level dielectric (ILD) material positioned on the transistor structure, wherein the ILD material includes a contact opening to one of the source/drain silicide or the gate metal of the transistor structure; a conductive contact within the contact opening such that the conductive contact is positioned over and electrically coupled to one of the source/drain silicide or the gate metal, where a material composition of the conductive contact includes a first metal; and an interface liner including a second metal positioned directly between the conductive contact and a sidewall of the ILD material.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings and it is to be understood that other embodiments may be used and that changes may be made without departing from the scope of the present teachings. The following description is, therefore, merely exemplary.

The present disclosure relates to integrated circuit (IC) structures with a conductive contact to a transistor, formed within a contact opening, and an interface liner positioned directly between the conductive contact and an inter-level dielectric (ILD) material. The material composition of the conductive contact can include a first metal, while the interface liner can include a second metal therein. The interface liner can be formed by diffusing the second metal from the conductive contact, initially doped to include the second metal, to the interface between the conductive contact and the ILD material. Thus, embodiments of the present disclosure also provide methods of forming the various structures described herein. In conventional IC structures, refractory metal liners (formed, e.g., of copper or tungsten) can be formed on the sidewalls of an opening and on an electrically insulative material to reduce current leakage, electromigration degradation, etc., of conductive elements formed in the opening. However, an increasing need for reduction in separation distance between adjacent components and reduced resistivity of such liner materials can be associated with various technical challenges and/or limitations. Among other advantages, the various embodiments described herein can improve or even supplant the use of refractory metal liners on sidewalls of conductive contacts. Applying metal dopants to structures and methods in embodiments of the present disclosure can also overcome other technical challenges not explicitly described.

Figure 1:
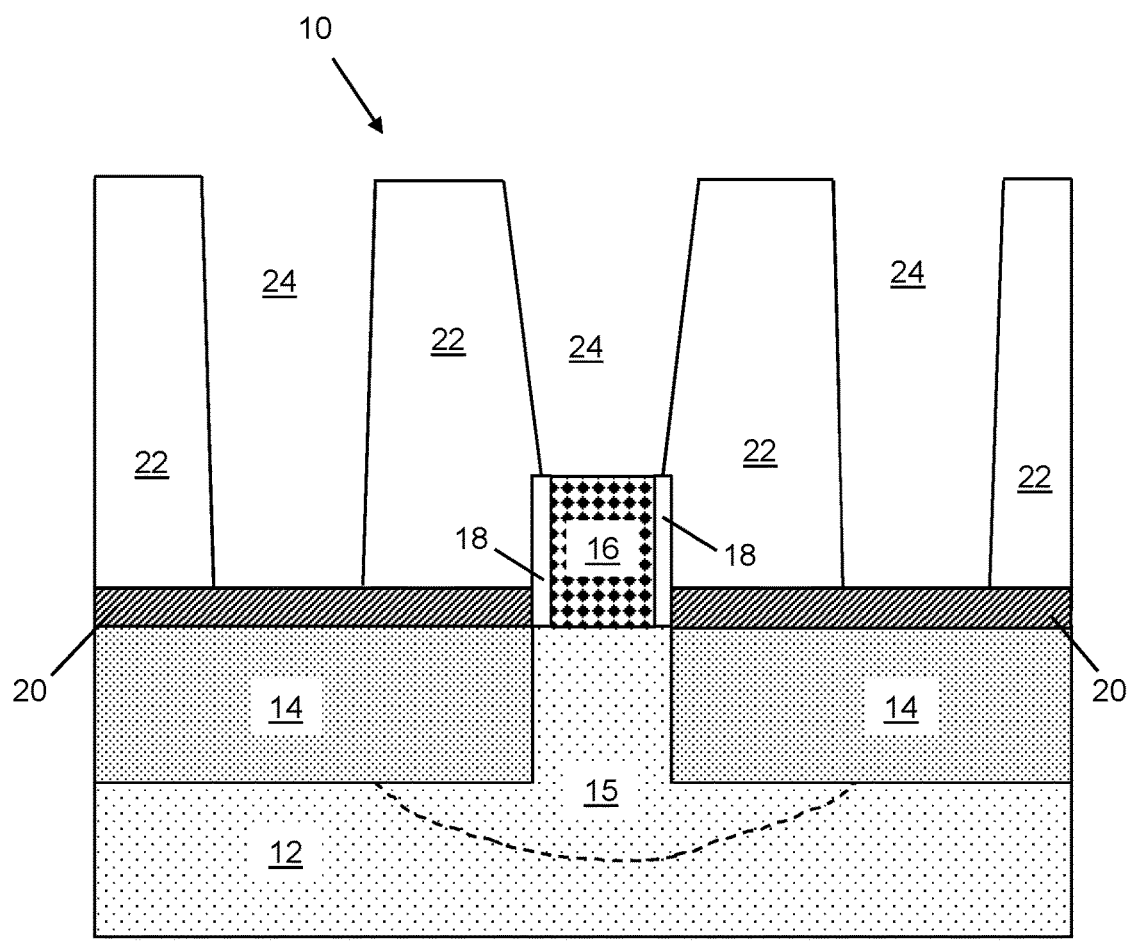
FIG. 1 shows a cross-sectional view of an initial IC structure with contact openings in embodiments of the present disclosure.

Referring to FIG. 1, a cross-sectional view of a structure 10 to be processed according to the present disclosure is shown. Structure 10 can be formed using conventional processing techniques and/or may be provided in its initial state before methods according to the present disclosure are implemented on structure 10. Structure 10 can include a substrate 12 of semiconductor material. Substrate 12 may be provided, e.g., as a bulk semiconductor substrate and/or a semiconductor on insulator (SOI) layer with insulating material thereunder. For the purposes of example and simplicity, other materials and/or layers positioned beneath substrate 12 have been omitted from the accompanying figures. Substrate 12 may include, e.g., silicon, germanium, silicon germanium, silicon carbide, and other materials consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and $X1+X2+X3+Y1+Y2+Y3+Y4=1$ (1 being the total relative mole quantity). Other materials suitable for the composition of substrate 12 can include II-VI compound semiconductors having a composition $Zn_{A1}Cd_{A2}Se_{B1}Te_{B2}$, where A1, A2, B1, and B2 are relative proportions each greater than or equal to zero and $A1+A2+B1+B2=1$ (1 being a total mole quantity). Furthermore, a portion or entire substrate 12 may be strained.

Substrate 12 is described generally by example herein as being in the form of any structure composed of semiconductor material, and in some embodiments may be formed as a single layer of semiconductive material, a semiconductor fin used in a finFET transistor, and/or other forms of semiconductor material typically used in the fabrication of IC products. A finFET refers to a transistor typically built from an SOI substrate, where semiconductor material positioned on a buried insulator layer is etched into one or more fin-shaped structures to act as a channel. It is understood that the various process steps discussed herein can be implemented in the same manner and/or with slight modifications for substrate 12 embodied in forms other than a silicon layer. Further, substrate 12 may be a remaining portion of a single semiconductor-on-insulator (SOI) substrate composed of a layer of semiconductor material bonded to and positioned over a buried insulator layer, as described elsewhere herein. Although substrate 12 is shown by example in FIGS. 1-5 as being in the form of one structure or region, it is therefore understood that processes according to the present disclosure can use any conceivable number of substrates 12.

Structure 10 can include source/drain regions 14 positioned directly on or within substrate 12, which may include the same semiconductive materials of substrate 12 and/or different semiconductor materials described elsewhere herein. Relative to substrate 12, source/drain regions 14 may also include dopant materials therein, e.g., to provide greater electrical conductivity relative to the remainder of substrate 12. A "dopant" material or materials introduced by "doping" generally refers to foreign materials added to a structural component to alter its electrical properties, e.g., resistivity and/or conductivity. As noted herein, conductive materials and/or semiconductive materials may including dopant compounds introduced, e.g., by any currently-known or later developed technique for introducing materials to the composition of a structure. Thus, source/drain regions 14 are illustrated in FIGS. 1-5 with a different texture from substrate 12 to emphasize optional differences in composition, despite substrate 12 and source/drain regions 14 possibly being continuous portions of a substrate 12.

Each source/drain region 14 can be laterally separated by a channel region 15 of substrate 12, and substrate 12 can include one or more gate metals 16 positioned thereon. Gate metal 16 on channel region 15 can be laterally separated from source/drain region(s) 14 and other components by sidewall spacers 18. Gate metal 16 can be composed of one or more electrically conducting materials including without limitation: metals, polysilicon, etc., positioned over substrate channel region 15 (e.g., directly on substrate 15 or separated therefrom by a thin gate dielectric layer (not shown) on substrate 12) by application of deposition and/or one or more other currently known or later-developed processes of forming a material. Applying a voltage bias to gate metal 16 can affect the electrical conductivity of channel region 15, such that current flow between source/drain regions 14 of substrate may selectively be enabled or disabled.

Sidewall spacers 18 can be provided as one or more bodies of insulating material formed laterally adjacent to gate metal 16, e.g., by deposition, thermal growth, etc., and may include materials and/or other structures formed on or adjacent to gate metal 16 to electrically and physically insulate gate metal 16 from other components of structure 10. In an example embodiment, sidewall spacers 18 can be provided as a region of silicon dioxide ($SiO_2$) with or without nitrides being included therein. In some cases, other types of insulators with higher dielectric constants (e.g., hafnium (Hf)-based dielectrics including oxide and/or silicate) can be used to form sidewall spacers 18. In general, sidewall spacers 18 and/or other electrically insulating materials described herein can be composed of any insulating material such as $SiO_2$ or a dielectric having a high dielectric constant, which may be, for example, above 3.9. Materials appropriate for the composition of sidewall spacers 18 may include, for example, silicon dioxide ($SiO_2$), silicon nitride (SiN), hafnium oxide ($HfO_2$), alumina ($Al_2O_3$), yttrium oxide ($Y_2O_3$), tantalum oxide ($Ta_2O_5$), titanium dioxide ($TiO_2$), praseodymium oxide ($Pr_2O_3$), zirconium oxide ($ZrO_2$), erbium oxide ($ErO_x$), and other currently known or later developed materials having similar properties. In any event, gate metal 16 and sidewall spacers 18 can together form a gate stack structure (i.e., a "metal gate stack") in which gate metal 16 is separated from overlying or adjacent elements by sidewall spacers 18. Gate metal 16 can function as a gate terminal of a transistor yielded from processes according to the present disclosure.

Structure 10 in embodiments of the present disclosure can include or be positioned directly beneath a region of source/drain silicide 20. Source drain silicide 20 may be formed using any now known or later developed technique, e.g., performing an in-situ pre-clean, and depositing a metal such as titanium (Ti), nickel (Ni), cobalt (Co), molybdenum (Mo), etc., on source/drain region 14. Thereafter, the deposited metal can be annealed to cause the metal to react with source/drain region 14. Any unreacted portions of the deposited metal may be removed, e.g., by additional etching. The resulting source/drain silicide 20 can have a higher electrical conductivity than a remainder of source/drain region 14, by having conductive metals therein, after the annealing. Source/drain silicide(s) 20 may provide an electrical connection from contacts formed thereon to multiple semiconductor elements (e.g., substrate 12, source/drain regions 14, and/or gate metal 16) simultaneously. Gate metal 16 and source/drain silicide(s) 20 may be identified collectively as "conductive regions" of structure 10.

An inter-level dielectric (ILD) material 22 may be formed on structure 10, e.g., on an upper surface of sidewall spacer(s) 18, source/drain silicide(s) 20, etc. ILD material 22 can physically and electrically separate source/drain regions 14, gate metal 16, sidewall spacers 18, and/or source/drain silicide(s) 20 from materials formed thereon, e.g., metal level layers formed on IC structure 10 during a BEOL fabrication process. In addition, ILD material 22 can be composed of one or more of the same or similar insulating materials discussed herein with respect to sidewall spacers 18, and/or can include other electrically insulating materials. More specifically, ILD material 22 can be composed of, for example, silicon oxide ($SiO_2$) or amorphous silicon. Other insulator materials used for ILD material 22 can include, e.g., silicon nitride ($Si_3N_4$), fluorinated $SiO_2$ (FSG), hydrogenated silicon oxycarbide (SiCOH), porous SiCOH, borophospho-silicate glass (BPSG), silsesquioxanes, near frictionless carbon (NFC), carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof. Portions of ILD material 22 and other materials can then be removed to form contact openings 24 where one or more conductive contacts can be formed as described herein. Each contact opening 24 can expose an upper surface of source drain region 14 (e.g., at source/drain silicide 20) and/or gate metal 16.

Figure 2:
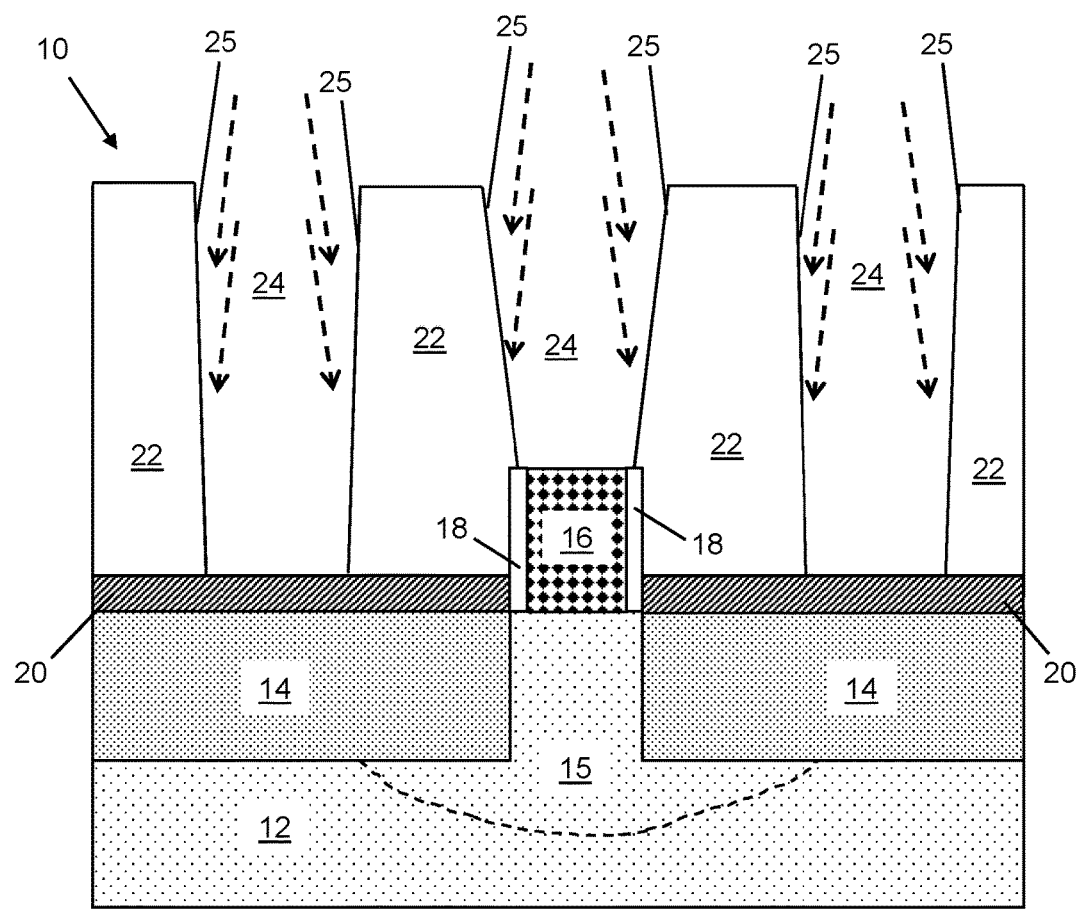
FIG. 2 shows a cross-sectional view of the contact openings being treated with a nitrogen plasma according to embodiments of the present disclosure.

Turning to FIG. 2, embodiments of the present disclosure can optionally include treating a group of exposed sidewalls 25 in openings 24 with a nitrogen plasma before forming any conductive materials within each opening 24. Applying a nitrogen plasma to exposed sidewalls 25 can facilitate the diffusion of particles formed in each opening 24 into ILD material 22 as described elsewhere herein. For example, applying a nitrogen plasma to exposed sidewalls 25 can change the composition of ILD material 22 at exposed sidewalls 25 by forming nitrogen and/or nitride particles only within a very thin layer of ILD material 22 at its outer surface. In an example embodiment, ILD material 22 can include nitrogen and/or nitride compounds up to a thickness of at most approximately five nanometers from its exterior surface after being treated, with the remainder of ILD material 22 being unchanged. Example processes for treating exposed sidewalls 25 with nitrogen plasma can include, e.g., immersing structure 10 and ILD material 22 in plasma, i.e., an ionized gas, denoted in FIG. 2 with phantom arrows. A plasma, as used herein, refers to a form of ionized gas having an electrical discharge which features an approximately equal concentration of ions and electrons. The plasma implemented during the immersion may be generated with the aid of a power source, such that nitrogen ions in the plasma react with and treat exposed sidewalls 25. The treatment of exposed sidewalls 25 with plasma may be omitted in some embodiments.

Figure 3:
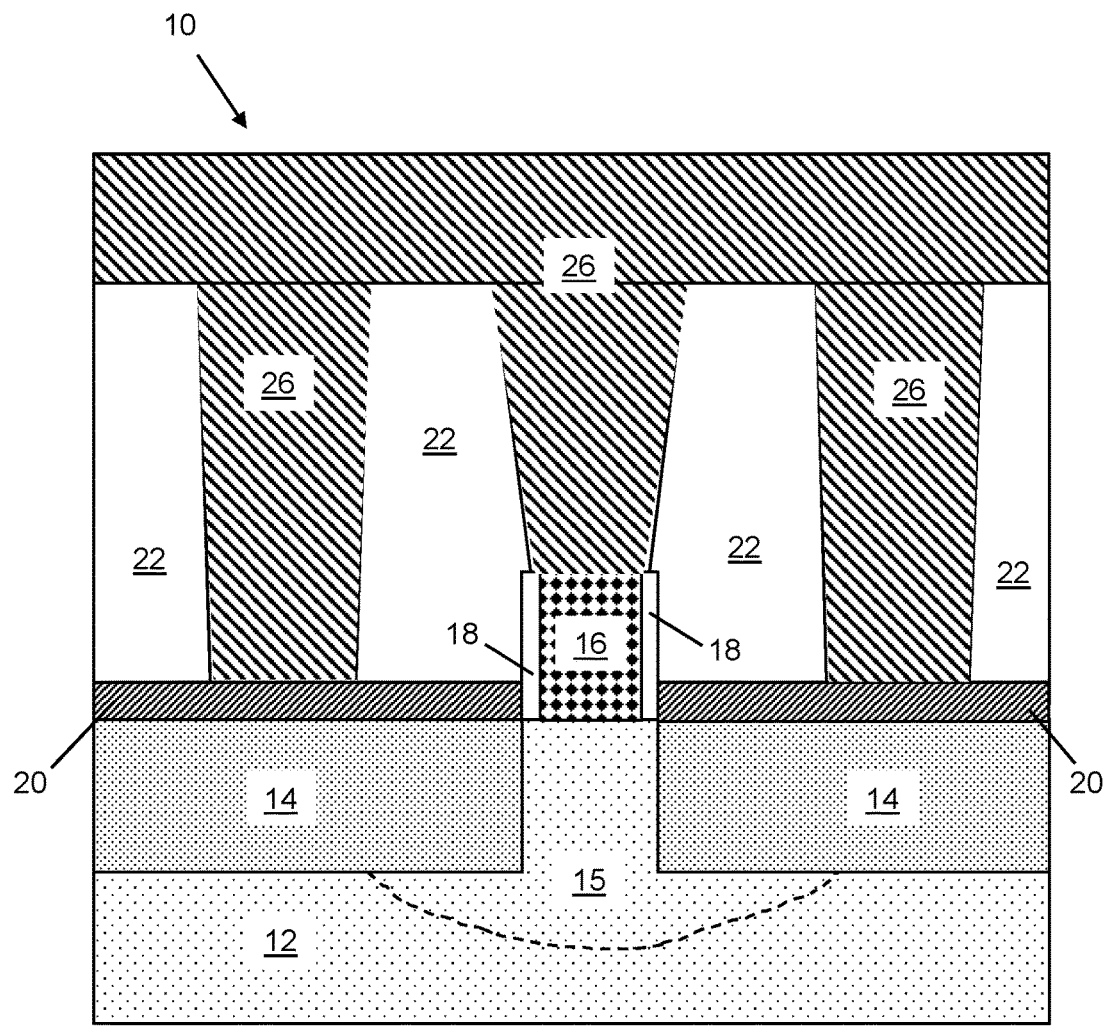
FIG. 3 shows cross-sectional views of forming a doped metal on the initial IC structure according to embodiments of the present disclosure.

Turning to FIG. 3, embodiments of the present disclosure can include forming a doped metal layer ("doped layer") 26 on ILD material 22 and within contact openings 24 (FIGS. 1-2). After being formed, doped layer 26 can contact and/or directly overlie source/drain region 14, gate metal 16, and/or source/drain silicides 20. Doped layer 26 can include one or more metals which can be formed, e.g., by deposition. As used herein, the term "deposition" generally refers to any currently known or later developed technique appropriate for doped layer 26 or other materials to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and/or evaporation.

Doped layer 26 can include one or more metallic compounds therein, and in various embodiments can include a first metal compound ("first metal") doped with a second metal compound ("second metal"). Doped layer 26 can be doped to include the first and second metals therein in-situ after being formed on ILD material 22, or alternatively may be doped in a separate process before the doped material is placed on structure 10. For instance, doped layer 26 can be formed using a single precursor material (e.g., an amidinate material) including two metallic compounds therein, which may be deposited onto structure 10 in a single process. In an example implementation, doped layer 26 can primarily include cobalt (Co) in an atomic concentration of, e.g., at least approximately ninety-five percent of the total mass of doped layer 26. The second metal of doped layer 26 can include, e.g., manganese (Mn) and/or other metals which may diffuse from doped layer 26 to other materials (e.g., insulators such as oxides) under the application of heat. The second metal may be provided in doped layer 26 at a significantly lower concentration relative to the first metal, and may represent at most approximately five percent of the total mass of doped layer 26. Thus, the second metal of doped layer 26 may serve as a dopant relative to the first metal. As alternative examples, doped layer 26 can include two distinct metals with similar properties and/or ability to react diffuse into or react with ILD material 22, e.g., aluminum doped with titanium, and/or other metals with similar physical properties. In general, the first and second metals in doped layer 26 can be different from one another. In the case where doped layer 26 includes cobalt, treating ILD material 22 with a nitrogen plasma (as depicted in FIG. 2) can allow cobalt to form on ILD material 22 more easily. Where ILD material 22 is not treated with a nitrogen plasma, one or more barrier layers (not shown) can alternatively be formed on ILD material 22 to allow cobalt to be formed thereon. In any event, doped layer 26 can be formed on ILD material 22 and/or within openings 24, e.g., by deposition and/or other currently known or later-developed processes of forming metal compounds on a structure. Doped layer 26 can serve as an initial metallic material for creating conductive contacts to source/drain region(s) 14, gate metal(s) 16, and/or source/drain silicide(s) 20 as described herein.

Figure 4:
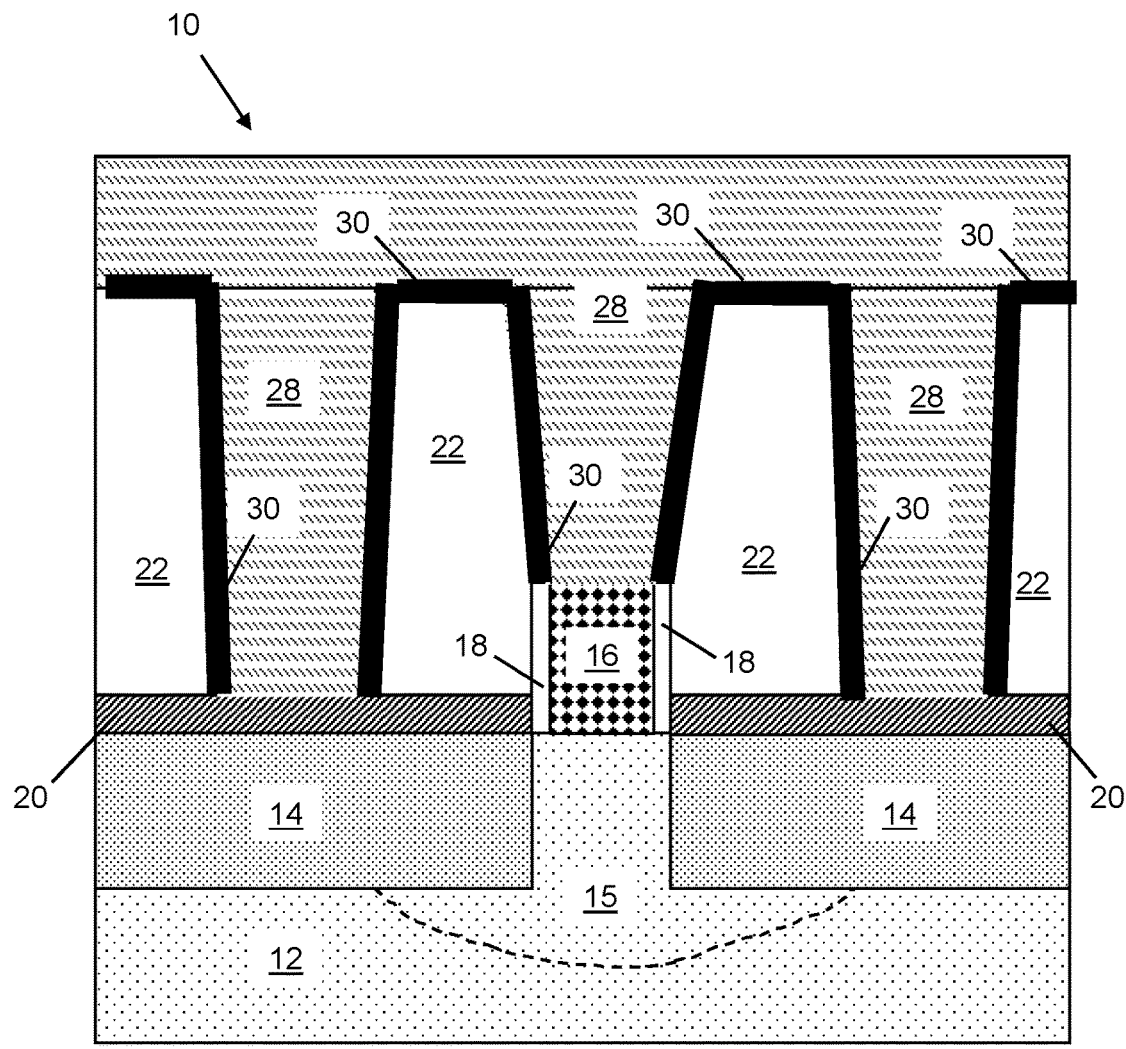
FIG. 4 shows a cross-sectional view of forming a contact to the conductive region by annealing the doped metal layer, according to embodiments of the present disclosure.

Referring to FIGS. 3 and 4 together, embodiments of the present disclosure can include processing doped layer 26 to change its electrical properties and form new materials. In particular, doped layer 26 can be annealed (e.g., at a temperature between approximately three-hundred and six-hundred degrees Celsius) such that the second metal in doped layer 26 diffuses into ILD material 22. After the annealing, the non-diffused portions of doped layer 26 (including, e.g., the annealed first metal) can become a contact 28 to underlying conductive regions, e.g., source/drain region(s) 14, gate metal(s) 16, source/drain silicide(s) 20, etc. The diffusion of the second metal into ILD material 22 can also form an interface liner 30 on an outer surface of ILD material 22 and directly between the remainder of ILD material 22 and contact 28. The second metal within doped layer 26 may not diffuse significantly into these materials, e.g., because their material composition does not include a substance (e.g., an oxide) capable of chemically reacting with the second metal. A technical advantage to the use and processing of doped layer 26 as described herein can include, e.g., the forming of interface liner 30 only on ILD material 22, without interface liner 30 being formed on exposed conductive surfaces (e.g., source/drain region(s) 14, gate metal(s) 16, source/drain silicide(s) 20). Where ILD material 22 includes silicon dioxide, the annealing can cause the second metal to diffuse into ILD material 22, where the second metal reacts with the silicon oxide to form a silicate compound. In embodiments where the second metal includes manganese, interface material 30 can include manganese silicate after the annealing, with the remainder of ILD material 22 including silicon oxide therein. Including manganese in doped layer 26 can further facilitate the forming of interface liner 30, e.g., because diffusion of manganese can be driven by oxygen compounds (e.g., silicon oxide within ILD material 22).

Figure 5:
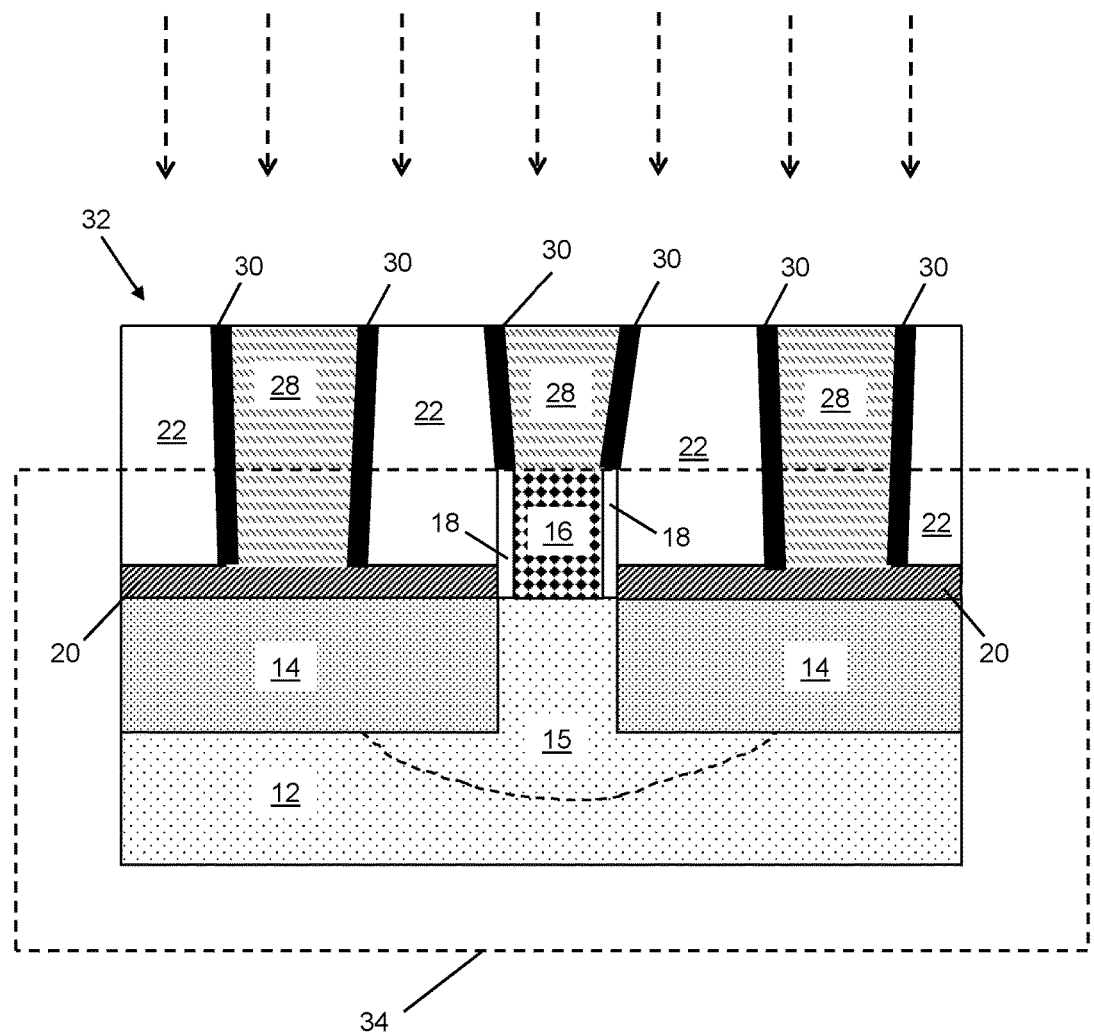
FIG. 5 shows a cross-sectional view of an IC structure according to embodiments of the present disclosure.

Turning to FIG. 5, an IC structure 32 according to embodiments of the present disclosure is shown. After the annealing of doped layer 26 (FIG. 3) to form contact 28 and interface liner 30, portions of ILD material 22, contact(s) 28, and/or interface liner 30 can be removed to yield IC structure 32 with physically separated contacts 28 and interface liners 30 therein. One such process of removal can include, e.g., chemical mechanical polishing (CMP) such that an upper surface of IC structure 32 lies on substantially a single horizontal plane. As noted herein, contacts 28 can include the first metal therein while interface liner 30 can include the second metal therein. The first metal can include cobalt (Co), while the second metal can include manganese (Mn), though alternative metals are contemplated and discussed elsewhere herein. Where ILD material 22 includes silicon dioxide, interface liner 30 can be composed of manganese silicate. As is shown, interface liner 30 can be entirely or almost entirely absent from the surfaces of source/drain region(s) 14, gate metal 16, and source/drain silicide(s) 20, causing interface liner 30 to be absent from any junctions between a lower surface of contact(s) 28 and portions of transistor structure 34.

As a result of being processed according to the present disclosure, IC structure 32 can include a transistor structure 34 including substrate 12, source/drain region 14, channel region 15, and gate metal 16 as described herein, with source/drain silicides 20 included to provide further conductivity between contacts 28 and source/drain region 14. Contact 28 can be positioned within the original site of contact opening(s) 24 (FIGS. 1, 2) such that contact 28 is positioned over, electrically coupled to, and/or in contact with source/drain silicide(s) 20 and gate metal(s) 28. Interface liner 30 with the second metal therein may be positioned directly between contact 28 and sidewalls 25 (FIG. 2) of ILD material 22. As noted herein, interface liner(s) 30 of IC structure 32 can be substituted for refractory metal liners in various IC applications and/or products.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately" and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method of forming an integrated circuit (IC) structure, the method comprising:
   providing a structure including:
   a conductive region, and
   an inter-level dielectric (ILD) material positioned on the conductive region, wherein the ILD material includes a contact opening to the conductive region;
   forming a doped metal layer within the contact opening such that the doped metal layer overlies the conductive region, wherein the doped metal layer includes a first metal doped with a second metal; and
   forming a contact to the conductive region within the contact opening of the ILD material by annealing the doped metal layer such that the second metal diffuses into the ILD material to form an interface liner directly between the annealed doped metal layer and the ILD material,
   wherein the interface liner is formed only on sidewalls of the contact opening and in direct contact with the ILD material, and
   wherein the interface liner is formed only at an interface of the doped metal layer and the ILD material.

2. The method of claim 1, wherein the conductive region comprises one of a transistor gate metal or a source/drain silicide.

3. The method of claim 1, wherein annealing the second metal includes diffusing the second metal from the doped metal layer into the ILD material to form the interface liner without diffusing into the conductive region.

4. The method of claim 1, wherein the first metal includes cobalt (Co).

5. The method of claim 1, wherein the ILD material includes silicon oxide, and wherein annealing causes the silicon oxide to react with the second metal to yield a silicate compound.

6. The method of claim 1, further comprising treating the sidewalls of the contact opening with a nitrogen plasma before forming the doped metal layer, wherein the nitrogen plasma enhances formation of the interface liner at the interface of the doped metal layer and the ILD material.

7. The method of claim 1, further comprising planarizing an upper surface of the doped metal layer and the ILD material after the annealing.

8. The method of claim 1, wherein annealing occurs at a temperature between approximately three-hundred and six-hundred degrees Celsius.

9. The method of claim 4, wherein the second metal includes manganese (Mn).

10. The method of claim 5, wherein the silicate compound includes manganese silicate.

11. A method of forming a transistor structure for an integrated circuit (IC), the method comprising:
    forming a contact opening within an ILD material positioned over the transistor structure, wherein forming the contact opening exposes a source/drain region and a gate metal of the transistor structure;
    forming a source/drain silicide on the source/drain region, after forming the contact opening;
    forming a doped metal layer within the contact opening, wherein the doped metal layer includes a first metal doped with a second metal; and
    forming a contact to the source/drain region and the gate metal within the contact opening of the ILD material by annealing the doped metal layer, such that the second metal diffuses into the ILD material to form an interface liner directly between the first metal and the ILD material,
    wherein the interface liner is formed only on sidewalls of the contact opening and in direct contact with the ILD material, and
    wherein the interface liner is formed only at an interface of the doped metal layer and the ILD material.

12. The method of claim 11, wherein the first metal includes cobalt (Co), and wherein the second metal includes manganese (Mn).

13. The method of claim 11, wherein annealing the second metal includes diffusing the second metal from the doped metal layer into the ILD material to form the interface liner, without the second metal diffusing into the gate region and the source/drain silicide of the transistor.

14. The method of claim 11, further comprising treating the sidewalls of the contact opening with a nitrogen plasma before forming the doped metal layer therein, wherein the nitrogen plasma enhances formation of the interface liner at the interface of the doped metal layer and the ILD material.

15. The method of claim 12, wherein the ILD material includes silicon oxide, and the annealing causes the silicon oxide compound to react with the manganese to yield manganese silicate.

* * * * *